US008736175B2

(12) United States Patent
Long et al.

(10) Patent No.: US 8,736,175 B2
(45) Date of Patent: May 27, 2014

(54) CURRENT CONTROL IN PLASMA PROCESSING SYSTEMS

(75) Inventors: Maolin Long, Cupertino, CA (US); Seyed Jafar Jafarian-Tehrani, Fremont, CA (US); Arthur Sato, San Jose, CA (US); Neil Martin Paul Benjamin, Austin, TX (US); Norman Williams, Carmel, CA (US)

(73) Assignee: Lam Research Corporation, Fremont, CA (US)

( * ) Notice: Subject to any disclaimer, the term of this patent is extended or adjusted under 35 U.S.C. 154(b) by 482 days.

(21) Appl. No.: 12/908,468

(22) Filed: Oct. 20, 2010

(65) Prior Publication Data

US 2011/0115379 A1    May 19, 2011

Related U.S. Application Data

(60) Provisional application No. 61/253,404, filed on Oct. 20, 2009.

(51) Int. Cl.
*H05B 31/26* (2006.01)
(52) U.S. Cl.
USPC ............ 315/111.21; 315/111.01; 156/345.24; 156/345.28
(58) Field of Classification Search
USPC ................. 315/111.21, 291, 307, 308, 344, 315/111.01, 111.11, 111.31, 111.41, 315/111.51, 111.61, 111.71, 111.81, 315/111.91; 317/154, 157
See application file for complete search history.

(56) References Cited

U.S. PATENT DOCUMENTS

| 4,973,857 | A | * | 11/1990 | Hughes .......................... 327/538 |
| 5,971,591 | A | * | 10/1999 | Vona et al. ..................... 700/220 |
| 6,308,654 | B1 | * | 10/2001 | Schneider et al. .......... 118/723 I |
| 6,617,794 | B2 | * | 9/2003 | Barnes et al. ............. 315/111.21 |
| 7,037,813 | B2 | * | 5/2006 | Collins et al. ................. 438/510 |
| 7,359,177 | B2 | * | 4/2008 | Yang et al. ..................... 361/234 |

OTHER PUBLICATIONS

Xiao, Hong. "Introduction to Semiconductor Manufacturing Technology", 2001, Prentice Hall, "Chapter 7: Plasma Basic." (ISBN: 978-0130224040).*

* cited by examiner

*Primary Examiner* — Douglas W Owens
*Assistant Examiner* — Borna Alaeddini
(74) *Attorney, Agent, or Firm* — Martine Penilla Group, LLP

(57) ABSTRACT

A plasma processing system for generating plasma to process at least a wafer. The plasma processing system includes a coil for conducting a current for sustaining at least a portion of the plasma. The plasma processing system also includes a sensor coupled with the coil for measuring a magnitude of a supplied current to provide a magnitude measurement without measuring any phase angle of the supplied current. The supplied current is the current or a total current that is used for providing a plurality of currents (e.g., including the current). The plasma processing system also includes a controller coupled with the sensor for generating a command using the magnitude measurement and/or information derived using the magnitude measurement, without using information related to phase angle measurement, and for providing the command for controlling the magnitude of the supplied current and/or a magnitude of the total current.

21 Claims, 3 Drawing Sheets

CURRENT CONTROL IN PLASMA PROCESSING SYSTEMS

PRIORITY CLAIM

The present invention claims priority under 35 U.S.C. 119 (e) to a commonly owned provisionally filed patent application entitled "Current Control in Plasma Processing Systems," U.S. Application No. 61/253,404, filed on Oct. 20, 2009, by inventors Long et al., all of which is incorporated herein by reference.

BACKGROUND OF THE INVENTION

The present invention relates to plasma processing systems. In particular, the present invention relates to plasma processing systems having capability of current control for controlling plasma characteristics (such as one or more of plasma density, plasma uniformity, etc.).

Plasma processing systems, such as inductively coupled plasma (ICP) systems and transformer coupled plasma (TCP) systems, are employed in various industries for fabricating devices on wafers. For example, the industries may include semiconductor, magnetic read/write and storage, optical system, and micro-electromechanical system (MEMS) industries. A plasma processing system may generate and sustain plasma in a plasma processing chamber to perform etching and/or deposition on a wafer such that device features may be formed on the wafer. In fabricating devices, it may be important to control plasma characteristics specified in particular recipes in order to satisfy certain production yield requirements and/or certain feature specifications.

Typically, plasma control may involve controlling the power delivered by the power generator (e.g., a radio frequency power generator, or RF generator) of a plasma processing system. In generally, there may be two typical power control modes: the forward power mode and the delivered power mode.

In the forward power mode, the RF generator may assume, for example, a 50 ohm load at the input of the match network of the plasma processing system. When the match network is tuned to 50 ohm, the power delivered to the input of the match network may be the same as the forward power. However, if the match network is not tuned to 50 ohm, there may be a reflected power, and thus the power delivered to the input of the match network may not be the same as the forward power.

In the delivered power mode, the RF generator may deliver the required power to the input of the match regardless of the impedance at the input of the match network. In the delivered power mode, there may be reflected power if the impedance at the input of the match network is not tuned to a predetermined value, for example, 50 ohm. If the impedance at the input of the match is tuned to 50 ohm, i.e., in matched condition and steady state, there may be no differences between the forward power mode and the delivered power mode.

In a typical power control mode, e.g., the forward power mode or the delivered power mode, the RF system of the plasma processing system may operate in an open loop utilizing predetermined power input, without responding to changes in important parameters. For example, the impedance at the output of the match network may change. The changes may be resulted from, for example, material deposition, component deformation, temperature changes during plasma processing, etc. in the plasma processing chamber. The changes may also be caused by the hardware layout variations from a plasma processing chamber to a different plasma processing chamber. As a result, even if the accuracy of the power of the RF generator and the accuracy of the reflected power of the match network are satisfactorily maintained, the changes of impedance at the output of the match network may cause substantial variations in the RF current(s) in the source coil(s) and may therefore cause significant variations in plasma characteristics, and thus variations on processing results on the wafers.

For achieving and maintaining the desirable plasma characteristics, even if the same recipe is employed, re-calibration may be required between process runs for processing different batches of wafers, and process re-qualification may be required when replacing components in a plasma processing system or when utilizing different plasma processing systems. Both re-calibration and process re-qualification may significantly reduce productivity and may significantly incur costs in manufacturing devices.

Attempts may be made to measure the power delivered to the output of the match network, for providing feedback to implement closed-loop power control. In general, measuring the power may require measuring the voltage, the current, and the phase angle between the voltage and the current associated with the power. A relatively small error in measuring the phase angle may result in a very significant error in the power measurement. For implementing the closed-loop power control, sophisticated sensors or measurement mechanisms with high accuracy levels may be required. As a result, substantial costs may be incurred.

SUMMARY OF INVENTION

An embodiment of the invention is related to a plasma processing system for generating plasma to process at least a wafer. The plasma processing system may include a first coil for conducting a first current for sustaining at least a first portion of the plasma. The plasma processing system may also include a first current magnitude sensor coupled with the first coil for measuring a magnitude of a supplied current to provide a first magnitude measurement without measuring any phase angle of the supplied current. The supplied current may be the first current or a total current that is used for providing a plurality of currents. The plurality of currents may include the first current if the supplied current is the total current. The plasma processing system may also include a first controller coupled with the first current magnitude sensor for generating a first command using at least one of the first magnitude measurement and information derived using the first magnitude measurement, without using information related to any phase angle measurement, and for providing the first command for controlling at least one of the magnitude of the supplied current and a magnitude of the total current.

The above summary relates to only one of the many embodiments of the invention disclosed herein and is not intended to limit the scope of the invention, which is set forth is the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
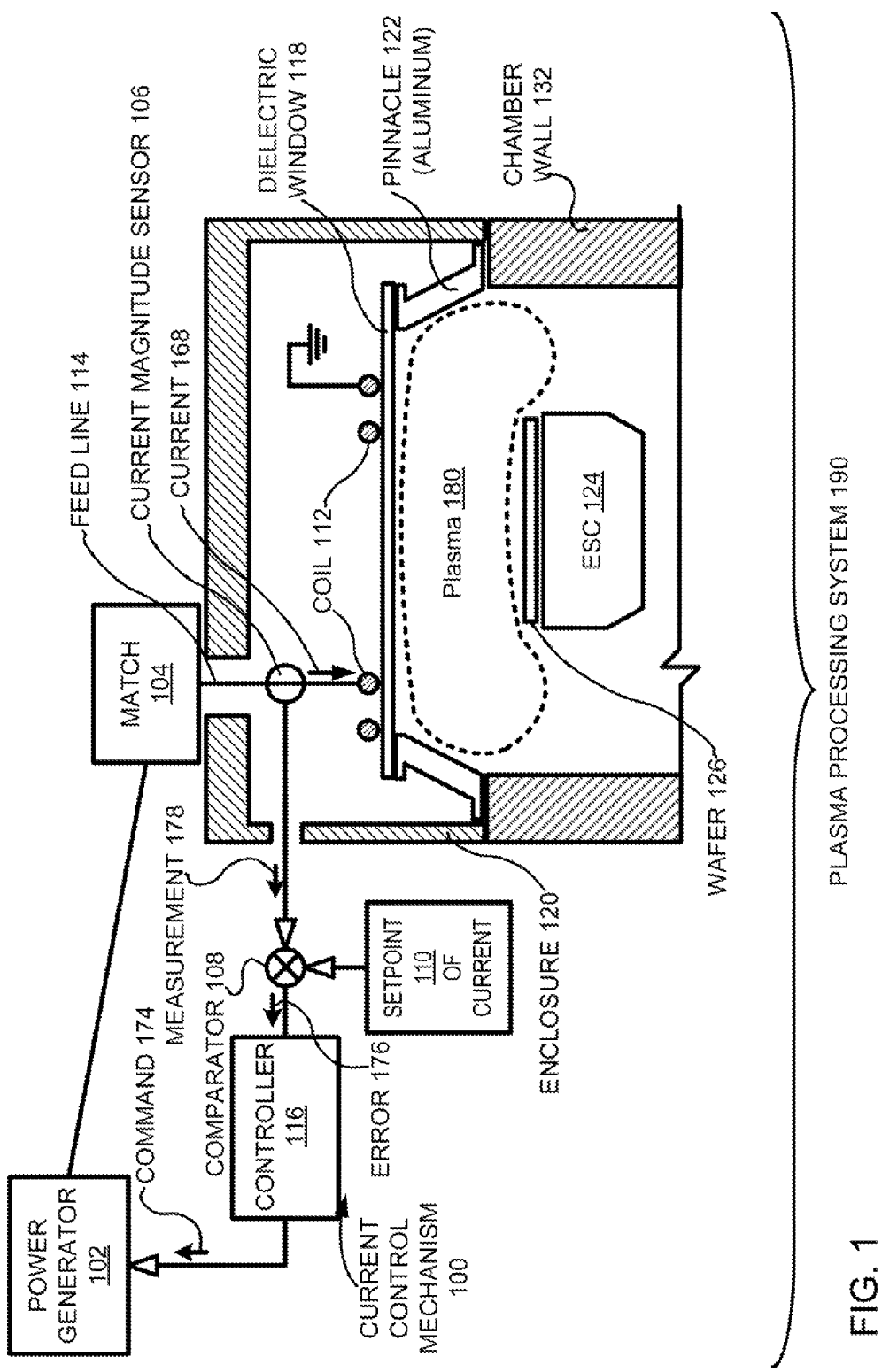
FIG. 1 shows a schematic representation illustrating a cross-sectional view of a plasma processing system including a current control mechanism in accordance with one or more embodiments of the present invention.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

One or more embodiments of the invention relate to a plasma processing system for generating plasma to process at least a substrate (or water). The plasma processing system may include a coil for conducting a supplied current (e.g., an RF current) for sustaining at least a portion of the plasma. The plasma processing system may also include a current magnitude sensor coupled with the coil. The current magnitude sensor may measure the magnitude of the supplied current to provide a magnitude measurement without measuring any phase angle of the supplied current. The plasma processing system may also include a controller coupled with the current magnitude sensor. The controller may generate a command utilizing the magnitude measurement and/or utilizing information derived using the first magnitude measurement, without utilizing information related to any phase angle measurement. The controller may provide the command to the power generator (e.g., an RF power generator) of the plasma processing system for controlling the magnitude of the supplied current.

The plasma processing system employs the current magnitude sensor to provide feedback information, thereby enabling closed-loop control of the supplied current. Advantageously, the characteristics of the plasma may be appropriately controlled to satisfy production yield requirements and/or feature specifications.

With closed-loop current control, embodiments of the invention may provide run-to-run process repeatability and chamber-to-chamber repeatability, eliminating the needs of re-calibration and re-qualification required for conventional plasma processing systems. Advantageously, embodiments of the invention may enable substantial productivity improvement and substantial cost saving in manufacturing devices.

In implementing the closed-loop control, embodiments of the invention may utilize low-cost current magnitude sensors, eliminating the needs of expensive, high-precision measurement mechanisms that measure phase angles. Advantageously, embodiments of the invention may minimize the costs associated with implementing closed-loop plasma characteristics control.

One or more embodiments of the invention relate to a plasma processing system that includes a splitter for providing even more controllability and/or granularity in controlling plasma characteristics, in addition to a closed-loop current control mechanism. The splitter may split a supplied current (or total current) into individual currents and may provide the individual currents to a plurality of coils to sustain different portions of plasma for processing different portions of a wafer. The plasma processing system may also include current magnitude sensors. Each of the current magnitude sensors may be coupled with one of the coils. The current magnitude sensors may measure the magnitudes of the individual currents, for enabling closed-loop control of one or more of the magnitudes of the individual currents and/or one or more ratios among the individual currents. Advantageously, plasma characteristics at different portions of the wafer may be individually adjusted to satisfy sophisticated processing requirements.

In one or more embodiments, for controlling the output of the power generator, the plasma processing system may include a dedicated current magnitude sensor for measuring the magnitude of the total current (or the supplied current) before the total current is divided into the individual currents by the splitter. The magnitude measurement of the total current may be utilized to control the output of the power generator. The dedicated current magnitude sensor may be different from the current magnitude sensors employed for controlling individual currents and/or for controlling ratios among the individual currents. Accordingly, power generator control (or total current control) and current ratio control (or individual current control) may be separately implemented, and the design and the implementation of the plasma processing system may be advantageously simplified.

In one or more embodiments, the magnitude measurement of at least one of the individual currents may be employed for controlling the output of the power generator. Advantageously, the need for a dedicated current magnitude sensor for measuring the magnitude of the total current may be eliminated, and the associated costs may be saved. In one or more embodiments, at least one additional magnitude measurement of one or more other individual currents also may be employed to provide redundant feedback information in controlling the output of the power generator. Advantageously, errors in performing control may be minimized.

One or more embodiments of the invention relate to a current control mechanism for use in a plasma processing system with one or more features and one or more advantages discussed above.

The features and advantages of the present invention may be better understood with reference to the figures and discussions that follow.

FIG. 1 shows a schematic representation illustrating a cross-sectional view of a plasma processing system 190 including a current control mechanism 100 in accordance with one or more embodiments of the present invention. Plasma processing system 100 may include a plasma processing chamber, which may include structural components such as a chamber wall 132, a pinnacle 122, a dielectric window 118, etc., for containing plasma, as illustrated by plasma 180. Inside the plasma processing chamber, plasma processing system 100 may include a chuck 124 (such as an electrostatic chuck) for supporting a wafer, as illustrated by wafer 126, during plasma processing.

Plasma processing system 100 may also include a power generator 102, such as a radio frequency power generator, or RF power generator. Plasma processing system 100 may also include a coil 112 disposed on dielectric window 118 and inside a coil enclosure 120, which may be coupled to chamber wall 132. Coil 112 may be electrically coupled with power generator 102, and power generator 102 may power a current 168 (e.g. an RF current) conducted by coil 112 for generating and/or sustaining at least a portion of plasma 180. Power generator 102 may also power one or more currents conducted by one or more additional coils for generating and/or sustaining different portions of plasma 180.

Current control mechanism 100 may include at least a current magnitude sensor 106 (e.g., an RF current magnitude sensor) and a controller 116. Current control mechanisms 100 may control the magnitude of at least current 168 (conducted by coil 112), for controlling characteristics of plasma 180.

Current magnitude sensor 106 may be coupled to a feed line 114 (e.g., an RF feed line) that couples coil 112 with a match network 104, wherein match network 104 is coupled between power generator 102 and coil 112 to provide current 168 to coil 112. Current magnitude sensor 106 may measure the magnitude of current 168 supplied to coil 112 without measuring any phase angle of the supplied current 168. As discussed in the background of the invention, measuring phase angles generally may require high-precision, high-cost measurement mechanisms and/or may cause significant control errors. By eliminating the requirements of measuring phase angles, embodiments of the invention may advantageously minimize errors and minimize costs. In addition, the precision requirements for current magnitude sensor 106 may not need to be high, as long as the errors of current magnitude sensor 106 are consistent, since calibration may be programmed at, for example, controller 116 or a comparator 108. Advantageously, costs associated with current magnitude sensor 106 may be minimized.

A current magnitude measurement 178 provided by current magnitude sensor 106 may be fed to comparator 108, which is coupled with current magnitude sensor 106. Comparator 108 may compare current magnitude measurement 178 with a setpoint 110 (e.g., an RF current magnitude setpoint) to generate an error signal 176. Controller 116, which is coupled between comparator 108 and power generator 102, may utilize error signal 176 (and/or current magnitude measurement 178) to generate a control command 174 (e.g., a power control command). Control command 174 may be provided to power generator 102 to control the magnitude of current 168 supplied to coil 112. In one or more embodiments, one or more other currents conducted by one or more other coils may be controlled in a similar manner.

In contrast with conventional open-loop systems, embodiments of the invention may provide closed-loop control for controlling current 168 conducted by coil 112 (and one or more other currents conducted by one or more other coils) without performing any phase angle measurements. Advantageously, embodiments of the invention may appropriately control plasma characteristics to satisfy production yield requirements and/or feature specifications with minimum costs.

Figure 2:
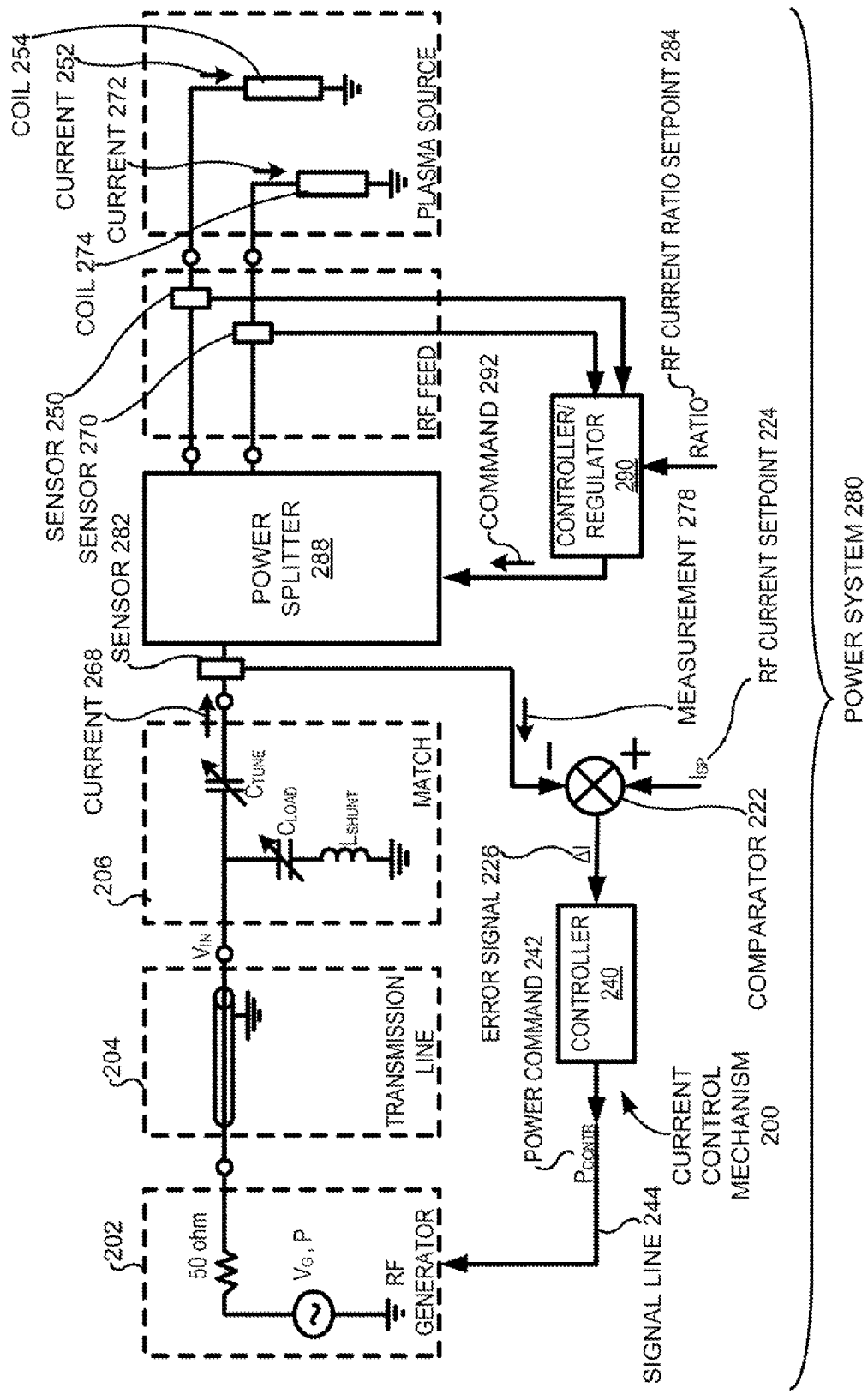
FIG. 2 shows a schematic representation illustrating an electrical model of a power system of a plasma processing system having a current control mechanism in accordance with one or more embodiments of the present invention.

FIG. 2 shows a schematic representation illustrating an electrical model of a power system 280 of a plasma processing system having a current control mechanism 200 in accordance with one or more embodiments of the present invention. The plasma processing system may include one or more structural components, such as a plasma processing chamber, a chuck, and/or a coil enclosure, similar to or different from one or more components of plasma processing system 190 discussed in the example of FIG. 1.

Power system 280 may include a power generator 202 (e.g., RF power generator) coupled to a splitter 288 (e.g., a power splitter) through a transmission line 204 and a match network 206. Splitter 288 (FIG. 2) may split a supplied current 268 (or total current 268) into individual currents and may provide the individual currents to a plurality of coils (which are coupled to splitter 288) for sustaining different portions of plasma, thereby further enhancing the controllability and/or the granularity controlling plasma Characteristics. For example, the coils may include a coil 274 and a coil 254. Coil 274 may conduct a current 272 for sustaining a first portion (e.g., a center portion) of the plasma. Coil 254 may conduct a current 252 for sustaining a second portion (e.g., an edge portion surrounding the center portion) of the plasma. Each of current 272 and current 252 may represent a portion of supplied current 268. In one or more embodiments, power system 280 may include one or more other coils which conduct one or more other portions of supplied current 268 for sustaining one or more other portions of the plasma, to provide even finer granularity in controlling plasma characteristics during processing a wafer. The different portions of the plasma may process different portion of the wafer.

Current control mechanism 200 may include a current magnitude sensor 282 (e.g., an RF current magnitude sensor) and a controller 240, for controlling the magnitude of supplied current 268 (or total current 268). Current magnitude sensor 282 may be coupled to a connection line (or a feed line) between power generator 202 and splitter 288, for measuring the magnitude of supplied current 268 to provide a current magnitude measurement 278. Current control mechanism 200 may also include a comparator 222 for generating an error signal 226 utilizing current magnitude measurement 278 and a setpoint 224. Setpoint 224 may be determined based on the specification of the magnitude of supplied current 268. Comparator 222 may provide error signal 226 to controller 240. Controller 240 may utilize error signal 226 (and/or magnitude measurement 278) to generate a command 242 (e.g., a power command). Controller 240 may provide command 242 to power generator 202, e.g., through a signal line 244, for controlling power generator 202 to control the magnitude of supplied current 268.

The features and the advantages of current magnitude sensor 282 and controller 240 may be similar to one or more features and one or more advantages of current magnitude sensor 106 and controller 116 discussed in the example of FIG. 1. For example, current magnitude sensor 282 may measure only the current magnitude without measuring any phase angles. Advantageously, the costs associated with current magnitude sensor 282 may be low, and possible errors associated with phase angle measurements may be avoided.

Current control mechanism 200 may also include a plurality of additional current magnitude sensors coupled with the coils and an additional controller 290 (or regulator 290) coupled with the additional current magnitude sensors. The additional current magnitude sensors and controller 290 may cooperate with splitter 288 for performing plasma control with enhanced granularity.

Each of the additional current magnitude sensors may be coupled with one of the coils for measuring the individual current conducted by each individual coil. For example, a current magnitude sensor 270 may be coupled with coil 274 for measuring the magnitude of current 272 conducted by coil 274; a current magnitude sensor 250 may be coupled with coil 254 for measuring the magnitude of current 252 conducted by coil 254. In one or more embodiments, one or more other current magnitude sensors may be coupled with one or more other coils for measuring one or more other individual current magnitudes. The current magnitude sensors may not measure any phase angles', therefore, costs associated with the additional current magnitude sensors may be minimized.

Controller 290 may utilize one or more current magnitude measurements provided by one or more of the additional current magnitude sensors, information derived using one or more current magnitude measurements, and/or a current ratio setpoint 284, to generate a control command 292. Control command 292 may be provided to splitter 288 for controlling one or more magnitudes of one or more of the individual currents and/or for controlling one or more ratios among the individual currents. Advantageously, plasma characteristics at different portions of the wafer may be individually and/or relatively adjusted to satisfy sophisticated processing requirements.

In power system 280, power generator control (or total current control) may be performed utilizing current magnitude sensor 282 and controller 240; splitter control (or individual current control) may be performed utilizing the additional current magnitude sensors (e.g., current magnitude sensor 270 and current magnitude sensor 250), controller 290, and splitter 288. Accordingly, power generator control (or total current control) and current ratio control (or individual current control) may be separately implemented and separately performed for controlling plasma characteristics with advanced granularity. Advantageously, the design, the implementation, the operation, and the maintenance of power system 280 may be simplified.

Figure 3:
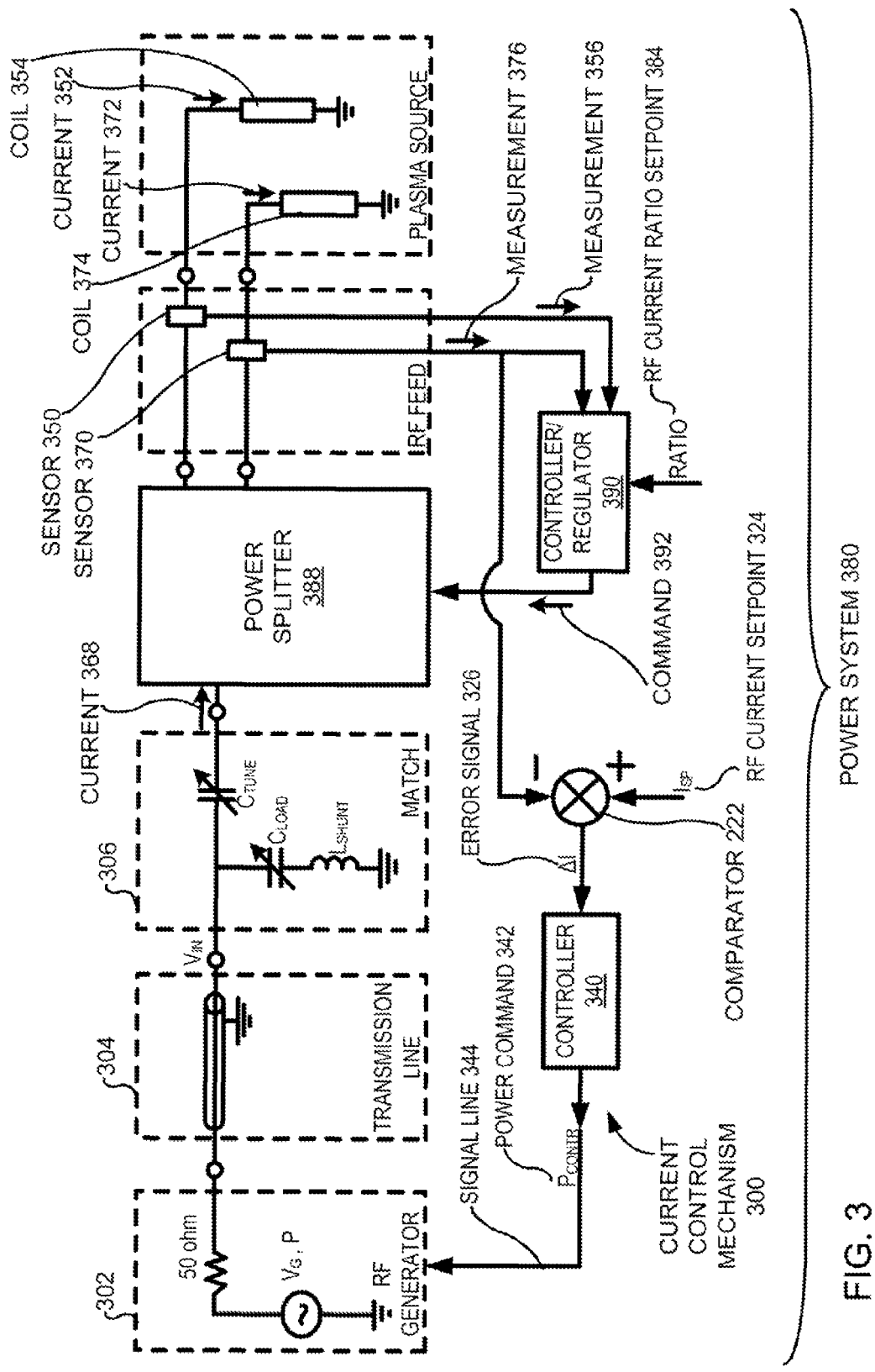
FIG. 3 shows a schematic representation illustrating an electrical model of a power system of a plasma processing system having a current control mechanism in accordance with one or more embodiments of the present invention.

FIG. 3 shows a schematic representation illustrating an electrical model of a power system 380 of plasma processing system having a current control mechanism 300 in accordance with one or more embodiments of the present invention. The plasma processing system may include one or more structural components, such as a plasma processing chamber, a chuck, and/or a coil enclosure, similar to or different from one or more components of plasma processing system 190 discussed in the example of FIG. 1.

Power system 380 may include a power generator 302 (e.g., an RF power generator) coupled to a splitter 388 (e.g., a power splitter) through a transmission line 304 and a match network 306. Splitter 388 may split a supplied current 368 (or total current 368) into individual currents and may provide the individual currents to a plurality of coils (which are coupled to splitter 388) for sustaining different portions of plasma, thereby further enhancing the controllability and/or the granularity in controlling plasma characteristics. For example, the coils may include a coil 374 and a coil 354. Coil 374 may conduct a current 372 for sustaining a first portion (e.g., a center portion) of the plasma. Coil 354 may conduct a current 352 for sustaining a second portion (e.g., an edge portion surrounding the center portion) of the plasma. In one or more embodiments, power system 380 may include one or more other coils for sustaining one or more other portions of the plasma, to provide even finer granularity in controlling plasma characteristics during processing a wafer. The different portions of the plasma may process different portion of the wafer.

Current control mechanism 300 may also include a plurality of current magnitude sensors (e.g., RF current magnitude sensors) coupled with the coils, a controller 340 coupled with at least one of the current magnitude sensors, and a controller 390 (or regulator 390) coupled with the current magnitude sensors. Controller 340 and at least one of the current magnitude sensors may cooperate with power generator 302 for controlling the magnitude of supplied current 368, thereby generally controlling plasma characteristics in the plasma processing chamber. Controller 390 and the current magnitude sensors may cooperate with splitter 388 for controlling the magnitudes of the individual currents, thereby controlling the plasma characteristics with enhanced granularity at different portions of the wafer.

For controlling the magnitude of supplied current, controller 340 may be coupled with power generator 302 and coupled with a current magnitude sensor 370 (e.g., an RF current magnitude sensor). Current magnitude 370 is coupled with coil 374 for measuring the magnitude of current 372 to provide a current magnitude measurement 376. Current control mechanism 300 may include a comparator 322 for generating an error signal 326 utilizing current magnitude measurement 376 and a setpoint 324. Setpoint 324 may be determined based on a specification for the magnitude of current 372, a specification for the magnitude of supplied current 368, and/or a specified relation between current 372 and supplied current 368. Comparator 322 may provide error signal 326 to controller 340. Controller 340 may utilize error signal 326 (and/or magnitude measurement 376) to generate a command 342 (e.g., a power command). Controller 340 may provide command 342 to power generator 302, e.g., through a signal line 344, for controlling power generator 302 to control the magnitude of supplied current 368.

The features and the advantages of current magnitude sensor 370 and controller 340 may be similar to one or more features and one or more advantages of current magnitude sensor 106 and controller 116 discussed in the example of FIG. 1. For example, current magnitude sensor 370 may measure only the current magnitude without measuring any phase angles. Advantageously, the costs associated with current magnitude sensor 370 may be minimized, and possible errors associated with phase angle measurements may be avoided.

In one or more embodiments, controller 340 and/or comparator 322 may be coupled with one or more additional current magnitude sensors associated with one or more other coils, and one or more additional magnitude measurements of one or more other individual currents also may be employed in controlling the output of power generator 302 and/or the magnitude of total current 368. With redundant feedback information, calibration errors and/or measurement errors may be minimized.

For controlling the magnitudes of the individual currents, controller 390 may be coupled with splitter 388 and coupled with the current magnitude sensors, and each of the current magnitude sensors may be coupled with one of the at least some of coils. Each current magnitude sensor may measure the magnitude of the individual current conducted by a coil. For example, as previously discussed, current magnitude sensor 370 may be coupled with coil 374 for measuring the magnitude of current 372 conducted by coil 374 to provide current magnitude measurement 376. As another example, a current magnitude sensor 350 may be coupled with coil 354 for measuring the magnitude of current 352 conducted by coil 354 to provide a current magnitude measurement 356. In one or more embodiments, one or more other current magnitude sensors may be couples with one or more other coils for measuring one or more other individual current magnitudes. The current magnitude sensors may not measure any phase angles; therefore, costs associated with the current magnitude sensors may be minimized, and possible errors associated with phase angle measurements may be prevented. In one or more embodiments, only selected coils may be coupled with current magnitude sensors. For example, current magnitude sensor 350 may not be included in one or more embodiments if current magnitude measurement 356 is not needed.

Controller 390 may utilize one or more of the current magnitude measurements (e.g., current magnitude measurement 376 and/or current magnitude measurement 356), information derived using one or more of the current magnitude measurements, and/or a current ration setpoint 384 to generate a control command 392. Control command 392 may be provided to splitter 388 for controlling one or more magnitudes of one or more of the individual currents and/or for controlling one or more ratios among the individual currents.

Advantageously, plasma characteristics at different portions of the wafer may be individually and/or relatively adjusted to satisfy sophisticated processing requirements.

In power system 380, current magnitude sensor 370 (and/or current magnitude measurement 376) may be utilized for both power generator control (or total current control) and splitter control (or individual current control). In contrast with power system 280 illustrated in the example of FIG. 2, power system 380 may eliminated the need of a dedicated current magnitude sensor in implementing power generator control. Advantageously, costs associated with implementing advanced plasma control may be minimized.

As can be appreciated from the foregoing, embodiments of the present invention may employ one or more current magnitude sensors in a plasma processing system to provide feedback information, thereby enabling closed-loop control of the current supplied for sustaining plasma. Advantageously, the characteristics of the plasma may be appropriately controlled to satisfy production yield requirements and/or feature specifications.

With closed-loop current control, embodiments of the invention may provide run-to-run process repeatability and chamber-to-chamber repeatability, eliminating the needs of re-calibration and re-qualification required for conventional plasma processing systems. Advantageously, embodiments of the invention may enable substantial productivity improvement and substantial cost saving in manufacturing devices.

In implementing the closed-loop control, embodiments of the invention may utilize low-cost current magnitude sensors, eliminating the needs of expensive, high-precision measurement mechanisms that measure phase angles. Advantageously, embodiments of the invention may minimize the costs associated with implementing closed-loop plasma characteristics control and may prevent possible errors associated with phase angle measurements.

Embodiments of the invention may include a splitter and a control mechanism for controlling individual currents applied for sustaining different portions of plasma. Advantageously, plasma characteristics at different portions of a wafer being processed may be individually adjusted to satisfy sophisticated processing requirements.

Embodiments of the invention may separate power generator control (total current control) and current ratio control (or individual current control) in a plasma processing system. Advantageously, the design and the implementation of the plasma processing system may be simplified.

Embodiments of the invention may utilize the same measurement of a current magnitude sensor for implementing both power generator control and current ratio control in a plasma processing system. Advantageously, the number of current magnitude sensors required in the plasma processing system may be minimized, and associated costs may be saved.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A plasma processing system for generating plasma to process at least a wafer, the plasma processing system comprising:
    a first coil for conducting a first current for sustaining at least a first portion of the plasma;
    a first current magnitude sensor coupled with the first coil for measuring a magnitude of a supplied current to provide a first magnitude measurement without measuring any phase angle of the supplied current, the supplied current being the first current or a total current that is used for providing a plurality of currents, the plurality of currents including the first current when the supplied current is the total current; and
    a first controller coupled with the first current magnitude sensor for generating a first command using at least one of the first magnitude measurement and information derived using the first magnitude measurement, without using information related to any phase angle measurement, and for providing the first command for controlling at least one of the magnitude of the supplied current and a magnitude of the total current.

2. The plasma processing system of claim 1 wherein the supplied current is the first current.

3. The plasma processing system of claim 1 further comprising:
    a splitter for splitting the supplied current, the first coil being coupled to the first current magnitude sensor through the splitter; and
    a second coil for conducting a second current for sustaining at least a second portion of the plasma, the second coil being coupled to the first current magnitude sensor through the splitter, the second current being among the plurality of currents, the supplied current being the total current.

4. The plasma processing, system of claim 3 further comprising:
    a second current magnitude sensor for measuring a magnitude of the first current to provide a second magnitude measurement, the first coil being coupled to the second current magnitude sensor;
    a third current magnitude sensor for measuring a magnitude of the second current to provide a third magnitude measurement, the second coil being coupled to the second current magnitude sensor; and
    a second controller coupled with the second current magnitude sensor and coupled with the third current magnitude sensor for generating a second command using at least one of the second magnitude measurement, the third magnitude measurement, information derived using the second magnitude measurement, and information derived using the third magnitude measurement, the second controller being coupled with the splitter for providing the second command to the splitter for controlling at least one of the magnitude of the first current and the magnitude of the second current.

5. The plasma processing system of claim 4 wherein the second controller generates the second command without using any phase angle measurement.

6. The plasma processing system of claim 1 further comprising:
    a splitter for splitting the supplied current, the first coil being coupled to the first current magnitude sensor through the splitter; and
    a set of coils for conducting a set of currents for sustaining at least a set of portions of the plasma other than the first portion of the plasma, the set of coils being coupled to the first current magnitude sensor through the splitter, the set of currents being among the plurality of currents, the supplied current being the total current, the set of coils including at least two coils.

7. The plasma processing system of claim 6 further comprising:
a second current magnitude sensor for measuring a magnitude of the first current to provide a second magnitude measurement, the first coil being coupled to the splitter through the second current magnitude sensor;
a set of current magnitude sensors, the set of current magnitude sensors being for measuring magnitudes of the set of currents to provide a set of magnitude measurements, each of the set of magnitude measurements being associated with one of the set of currents, each of the set of coils being coupled to one of the set of current magnitude sensors; and
a second controller coupled with the second current magnitude sensor and coupled with the set of current magnitude sensors for generating a second command using at least one of the second magnitude measurement, at least one of the set of magnitude measurements, information derived using the second magnitude measurement, and information derived using the at least one of the set of magnitude measurements, the second controller being coupled with the splitter for providing the second command to the splitter for controlling at least one of the magnitude of the first current and one or more of the magnitudes the set of currents.

8. The plasma processing system of claim 1 further comprising:
a splitter for splitting the supplied current, the first coil being coupled with the splitter, the supplied current being the first current; and
a second coil for conducting a second current for sustaining at least a second portion of the plasma, the second coil being coupled to the splitter, the second current being among the plurality of currents.

9. The plasma processing system of claim 8 further comprising a second controller coupled with the first current magnitude sensor for generating a second command using at least one of the first magnitude measurement and information derived using the first magnitude measurement, the second controller being coupled with the splitter for providing the second command to the splitter for controlling at least one of the magnitude of the first current and a magnitude of the second current.

10. The plasma processing system of claim 8 further comprising:
a second current magnitude sensor for measuring a magnitude of the second current to provide a second magnitude measurement, the second coil being coupled to the second current magnitude sensor; and
a second controller coupled with the first current magnitude sensor and with the second current magnitude sensor for generating a second command using at least one of the first magnitude measurement, the second magnitude measurement, information derived using the first magnitude measurement, and information derived using the second magnitude measurement, the second controller being further coupled with the splitter for providing the second command to the splitter for controlling at least one of the magnitude of the first current and the magnitude of the second current.

11. The plasma processing system of claim 10 wherein the second controller generates the second command without using any phase angle measurement.

12. The plasma processing system of claim 1 further comprising:
a splitter for splitting the total current, the first coil being coupled to the splitter, the supplied current being the first current; and
a set of coils for conducting a set of currents for sustaining at least a set of portions of the plasma other than the first portion of the plasma, the set of coils being coupled to the splitter, the set of currents being among the plurality of currents, the set of coils including at least two coils.

13. The plasma processing system of claim 12 further comprising a second controller coupled with the first current magnitude sensor for generating a second command using at least one of the first magnitude measurement and information derived using the first magnitude measurement, the second controller being coupled with the splitter for providing the second command to the splitter for controlling at least one of the magnitude of the first current and one or more magnitudes of the set of currents.

14. The plasma processing system of claim 12 further comprising:
a set of current magnitude sensors for measuring magnitudes of the set of currents to provide a set of magnitude measurements, each of the set of coils being coupled to one of the set of current magnitude sensors; and
a second controller coupled with the first current magnitude sensor and coupled with the set of current magnitude sensors for generating a second command using at least one of the first magnitude measurement, at least one of the set of magnitude measurements, information derived using the first magnitude measurement, and information derived using, the at least one of the set of magnitude measurements, the second controller being coupled with the splitter for providing the second command to the splitter for controlling at least one of the magnitude of the first current and one or more magnitudes of the set of currents.

15. A mechanism for performing current control in a plasma processing system, the plasma processing system including at least a first coil for conducting a first current for sustaining at least a first portion of plasma, the mechanism comprising:
a first current magnitude sensor coupled with the first coil for measuring a magnitude of a supplied current to provide a first magnitude measurement without measuring any phase angle of the supplied current, the supplied current being the first current or a total current that is used for providing a plurality of currents, the plurality of currents including the first current when the supplied current is the total current, and
a first controller coupled with the current magnitude sensor for generating a first command using at least one of the first magnitude measurement and information derived using the first magnitude measurement, without using information related to any phase angle measurement, and for providing the first command for controlling at least one of the magnitude of the supplied current and a magnitude of the total current.

16. The mechanism of claim 15 wherein the supplied current is the first current.

17. The mechanism of claim 15 further including at least a second coil for conducting a second current for sustaining at least a second portion of the plasma, the mechanism further comprising:
a splitter for splitting the supplied current, the first coil being coupled to the first current magnitude sensor through the splitter, the second coil being coupled to the first current magnitude sensor through the splitter, the second current being among the plurality of currents, the supplied current being the total current;

a second current magnitude sensor for measuring a magnitude of the first current to provide a second magnitude measurement, the first coil being coupled to the second current magnitude sensor;

a third current magnitude sensor for measuring a magnitude of the second current to provide a third magnitude measurement, the second coil being coupled to the second current magnitude sensor; and a second controller coupled with the second current magnitude sensor and coupled with the third current magnitude sensor for generating a second command using at least one of the second magnitude measurement, the third magnitude measurement, information derived using the second magnitude measurement, and information derived using the third magnitude measurement, the second controller being coupled with the splitter for providing the second command to the splitter for controlling at least one of the magnitude of the first current and the magnitude of the second current.

18. The mechanism of claim 17 wherein the second controller generates the second command without using any phase angle measurement.

19. The mechanism of claim 15 wherein the plasma processing system further including at least a second coil for conducting a second current for sustaining at least a second portion of the plasma, the mechanism further comprising:

a splitter for splitting the supplied current, the first coil being, coupled with the splitter, the supplied current being the first current, the second coil being coupled to the splitter, the second current being among the plurality of currents; and a second controller coupled with the first current magnitude sensor for generating a second command using at least one of the first magnitude measurement and information derived using the first magnitude measurement, the second controller being coupled with the splitter for providing the second command to the splitter for controlling at least one of the magnitude of the first current and a magnitude of the second current.

20. The mechanism of claim 15 wherein the plasma processing system further including at least a second coil for conducting a second current for sustaining at least a second portion of the plasma, the mechanism further comprising:

a splitter for splitting the supplied current, the first coil being coupled with the splitter, the supplied current being the first current, the second coil being coupled to the splitter, the second current being among the plurality of currents;

a second current magnitude sensor for measuring a magnitude of the second current to provide a second magnitude measurement, the second coil being coupled to the splitter; and a second controller coupled with the first current magnitude sensor and with the second current magnitude sensor for generating a second command using at least one of the first magnitude measurement, the second magnitude measurement, information related to the first magnitude measurement, and information related to the second magnitude measurement, the second controller being further coupled with the splitter for providing the second command to the splitter for controlling at least one of the magnitude of the first current and the magnitude of the second current.

21. A plasma processing system for generating plasma to process at least a wafer, the plasma processing system comprising;

a first coil for conducting a first current for sustaining at least a first portion of the plasma;

a first current magnitude sensor coupled with the first coil for measuring a magnitude of a supplied current to provide a first magnitude measurement without measuring any phase angle of the supplied current, the supplied current being the first current or a total current that is used for providing a plurality of currents, the plurality of currents including the first current when the supplied current is the total current;

a first controller coupled with the first current magnitude sensor for generating a first command using at least one of the first magnitude measurement and information derived using the first magnitude measurement, without using information related to any phase angle measurement, and for providing the first command for controlling at least one of the magnitude of the supplied current and a magnitude of the total current;

a splitter for splitting the supplied current, the first coil being coupled with the splitter, the supplied current being the first current;

a second coil for conducting a second current for sustaining at least a second portion of the plasma, the second coil being coupled to the splitter, the second current being among the plurality of currents; and a second controller coupled with the first current magnitude sensor for generating a second command using at least one of the first magnitude measurement and information derived using the first magnitude measurement, the second controller being coupled with the splitter for providing the second command to the splitter for controlling at least one of the magnitude of the first current and a magnitude of the second current.

* * * * *